United States Patent
Sawai

(10) Patent No.: US 8,242,945 B2
(45) Date of Patent: Aug. 14, 2012

(54) SUCCESSIVE APPROXIMATION TYPE AD CONVERTER AND TEST METHOD THEREOF

(75) Inventor: Yasunori Sawai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 68 days.

(21) Appl. No.: 12/846,281

(22) Filed: Jul. 29, 2010

(65) Prior Publication Data

US 2011/0043400 A1    Feb. 24, 2011

(30) Foreign Application Priority Data

Aug. 18, 2009    (JP) .................................. 2009-189564

(51) Int. Cl.
*H03M 1/12*    (2006.01)
(52) U.S. Cl. ........................................ 341/155; 341/144
(58) Field of Classification Search .................. 341/144, 341/155, 172, 120, 118, 143
See application file for complete search history.

(56) References Cited

U.S. PATENT DOCUMENTS

| | | | | |
|---|---|---|---|---|
| 5,185,607 A | * | 2/1993 | Lyon et al. | 341/120 |
| 7,663,518 B2 | * | 2/2010 | Hurrell | 341/131 |
| 2011/0115658 A1 | * | 5/2011 | Carreau | 341/118 |

FOREIGN PATENT DOCUMENTS

JP    2004-260263 A    9/2004

OTHER PUBLICATIONS

Tang et al., Analog to digital converter with built-in circuit function test, Aug. 1, 2004.*

* cited by examiner

*Primary Examiner* — Peguy Jean Pierre
(74) *Attorney, Agent, or Firm* — Sughrue Mion, PLLC

(57) ABSTRACT

A successive approximation type analog-to-digital (AD) converter includes: a converting and comparing section configured to compare an input analog signal and an analog signal as an analog conversion result of a digital data; and a successive approximation section configured to change the digital data based on the comparison result by the converting and comparing section. The converting and comparing section includes: a DA (digital-to-analog) section configured to perform an analog conversion on the digital data of a predetermined number of bits in an ordinary mode, and on the digital data of bits smaller than the predetermined number of bits in a test mode.

10 Claims, 10 Drawing Sheets

SUCCESSIVE APPROXIMATION TYPE AD CONVERTER AND TEST METHOD THEREOF

INCORPORATION BY REFERENCE

This patent application claims a priority on convention based on Japanese Patent Application No. 2009-189564 filed on Aug. 18, 2009. The disclosure thereof is incorporated herein by reference.

TECHNICAL FIELD

The present invention relates to a successive approximation type analog-to-digital (AD) converter and a test method thereof.

BACKGROUND ART

As an AD converter for converting an analog signal into a digital signal, a successive approximation type AD converter is known. The successive approximation type AD converter is preferably used for a measurement apparatus and an analyzer requiring a high precision, and for a medical device, since being able to realize the digital conversion in high precision.

The successive approximation type AD converter compares an analog signal converted by a DAC (a local analog signal) with an input analog signal, and converts a digital signal into an analog signal again according to the comparison result by using the DAC and compares the converted analog signal with the input analog signal. The successive approximation type AD converter can output a digital signal based on an analog signal by repeating this operations.

In these years, digital conversion with high resolution is demanded, and thus the number of bits of conversion resultant digital data is increasing. For this reason, the successive approximation type AD converter includes a main DAC (digital-to-analog converter) for converting upper bits of digital data into analog data, and a sub DAC for converting the lower bits of the digital data into analog data, and thus realizes the digital conversion with high resolution. A low power consumption apparatus with high accuracy which is superior in performance such as an S/N ratio (Signal to Noise ratio) and THD (Total Harmonic Distortion) can be realized by using the successive approximation type AD converter.

FIG. 1 is a conventional diagram showing a configuration of the successive approximation type AD converter described in Patent Literature 1 (JP 2004-260263A). Referring to FIG. 1, the conventional successive approximation type AD converter will be described. In the successive approximation type AD converter, a voltage resistance—dividing type DAC using a resistance string and an electric charge distribution type DAC using a capacitance array are as the main DAC and the sub DAC. When a combination of the main DAC and the sub DAC is described in order of the main DAC—the sub DAC, successive approximation type AD converters employing the voltage resistance—dividing type DAC (main)—the voltage resistance—dividing type DAC (sub), the voltage resistance—dividing type DAC (main)—the electric charge distribution type DAC (sub), the electric charge distribution type DAC (main)—the electric charge distribution type DAC (sub), and the electric charge distribution type DAC (main)—the voltage resistance—dividing type DAC (sub) are known. Among them, the electric charge distribution type DAC (main)—the voltage resistance—dividing type DAC (sub) (C-R type DAC) having a superior characteristic in the performance and size is preferably used.

The successive approximation type AD converter shown in FIG. 1 includes the C-R type DAC having a voltage resistance—dividing type DAC 51 and an electric charge distribution type DAC 52, a comparator 60, and a comparison control circuit 70. The C-R type DAC converts digital data from the comparison control circuit 70 into analog data and outputs the analog data to the comparator 60. In this case, the electric charge distribution type DAC 52 converts upper bits of the digital data into analog data, and the voltage resistance—dividing type DAC 51 converts lower bits of the digital data into analog data.

The electric charge distribution type DAC 52 includes a switch circuit 520 for controlling connection between a capacitance array and a reference voltage Vref or an output voltage of the resistance—dividing type DAC 51 in accordance with digital data. The switch circuit 520 carries out a sampling control of an input analog signal and an electric charge distribution control in the electric charge distribution type DAC 52 in accordance with digital data from the comparison control circuit 70.

When sampling the input analog signal, the switch circuit 520 stores an electric charge according to the input analog signal in the capacitance array by connecting the input terminal of the analog signal and the capacitance array. After the sampling of the input analog signal, the switch circuit 520 controls an amount of the electric charge stored in the electric charge distribution type DAC 52 trough a switching operation according to the upper 4 bits of the digital data. Meanwhile, in the voltage resistance—dividing type DAC 51, a voltage resistance dividing terminal selected in accordance with the lower 4 bits of the digital data is connected to the capacitance array. In this manner, a difference between an analog signal corresponding to the 8-bit digital data and the sampled input analog signal (hereinafter, to be referred to as a local analog signal) is generated.

The local analog signal is supplied to the comparator 60. The comparator 60 compares a ground voltage (GND) with a voltage of the local analog signal, and outputs the comparison result to the comparison control circuit 70. In this manner, the analog signal corresponding to the digital data and the comparison result of the voltage level of the input analog signal are outputted to the comparison control circuit 70.

The comparison control circuit 70 sets the digital data on the basis of the inputted comparison result. As described above, the successive approximation type AD converter is able to set the digital signal corresponding to the sampled analog signal (a sample value) by repeating the comparison operation and the digital data setting. In this case, the digital data setting is carried out from the MSB (Most Significant Bit) to the LSB (Least Significant Bit) in turn.

CITATION LIST

[Patent Literature 1]: JP 2004-260263A

SUMMARY OF THE INVENTION

A resolution of the successive approximation type AD converter is determined depending on the number of bits of conversion resultant digital data. The successive approximation type AD converter shown in FIG. 1 can convert an analog signal into 8-bit digital data. However, in order to accept a control in high precision, the performance with higher resolution is required for an AD converter of a microcomputer in recent years. For example, a successive approximation type AD converter having a resolution with 12 bits or more is used.

In a case of shipping of a bare die (a bare chip) as a product, it is required to carry out a precision measurement of AD conversion in a wafer test. A low-cost tester used in a mass production test of a microcomputer can be used for the measurement in AD conversion precision with around 10 bits in performance. In the case of carrying out the analog measurement with high precision, it is required to use an analog tester used for the high precision measurement or to add an analog option to a digital tester.

However, when this high precision analog measurement apparatus is employed in the mass production test, a test cost will increase. In addition, when power supply voltages and signals are supplied through the probing, the measurement result sometimes becomes unstable because of a contact resistance in accordance with increase of the number of probes. Accordingly, when the wafer test is carried out to the high precision AD converter (for example, the successive approximation type AD converter 12 bits or more), it may be difficult to obtain a stable measurement result.

In an aspect of the present invention, a successive approximation type analog-to-digital (AD) converter includes: a converting and comparing section configured to compare an input analog signal and an analog signal as a analog conversion result of a digital data; and a successive approximation section configured to change the digital data based on the comparison result by the converting and comparing section. The converting and comparing section includes: a DA (digital-to-analog) section configured to perform an analog conversion on the digital data of a predetermined number of bits in an ordinary mode, and on the digital data of bits smaller than the predetermined number of bits in a test mode.

In another aspect of the present invention, a test method of a successive approximation type AD (Analog-to-Digital) converter, is achieved by comparing an input analog signal and an analog conversion result of a digital data; and by changing a value of the digital data based on the comparison result. The comparing is achieved by performing an analog conversion on the digital data of a predetermined number of bits in an ordinary mode, and on the digital data of bits smaller than the predetermined number of bits in a test mode.

According to the present invention, a cost of a mass production test to a high-performance successive approximation type AD converter can be reduced.

Moreover, even under environment of low-precision measurement, a test to the high-performance successive approximation type AD converter can be easily performed.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Figure 1:
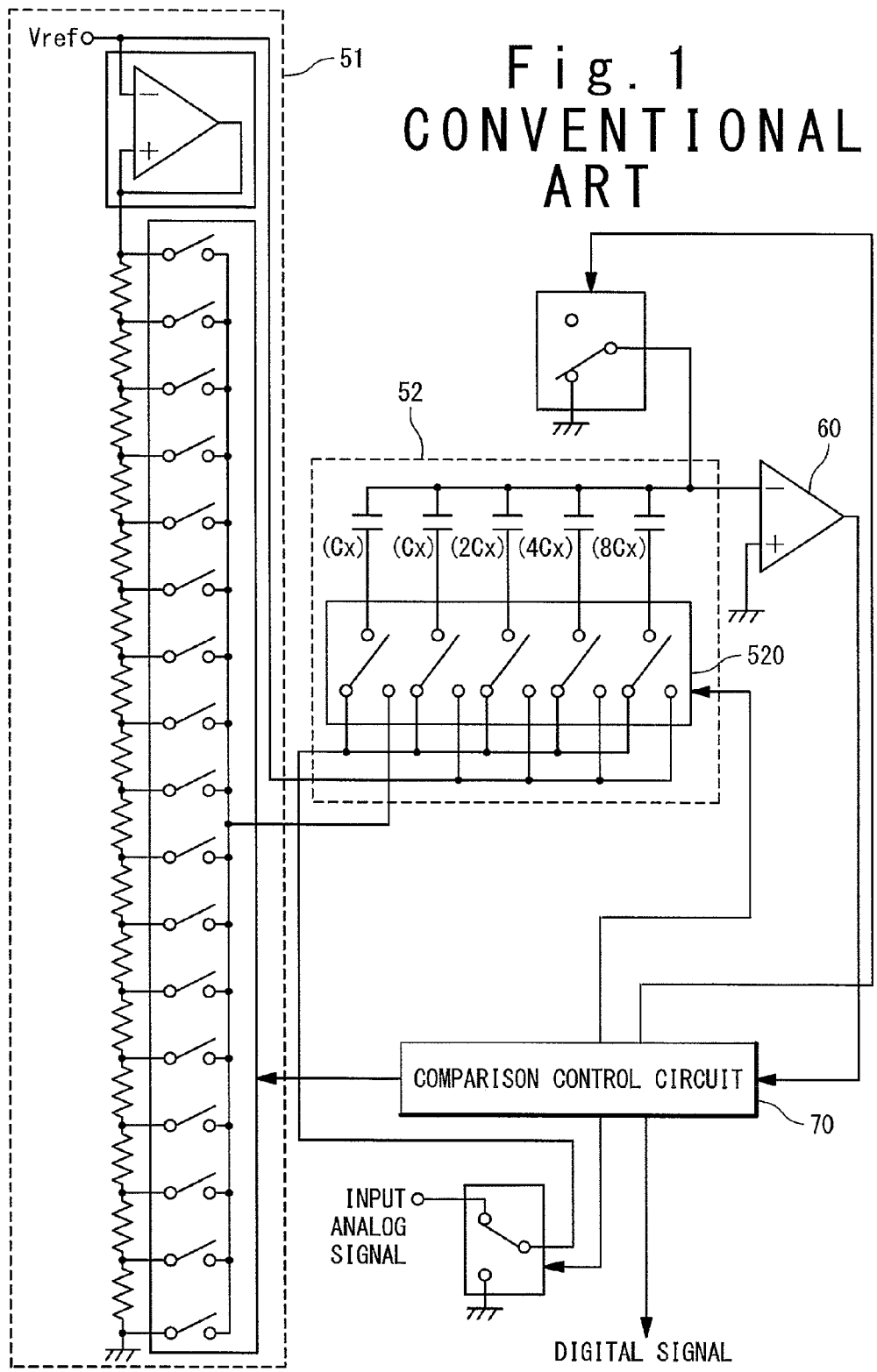
FIG. 1 is a diagram showing a configuration of a conventional successive approximation type AD converter.

Hereinafter, a successive approximation type analog-to-digital (AD) converter of the present invention will be described in detail with reference to the attached drawings. In the drawings, the same and similar reference numerals are assigned to the same and similar components. In embodiments described below, the successive approximation type AD converter of 12-bit resolution having a C-R type DAC will be described as one example.

[First Embodiment]

Referring to FIGS. 2 to 8, the successive approximation type AD converter according to a first embodiment of the present invention will be described.

(Configuration)

Figure 2:
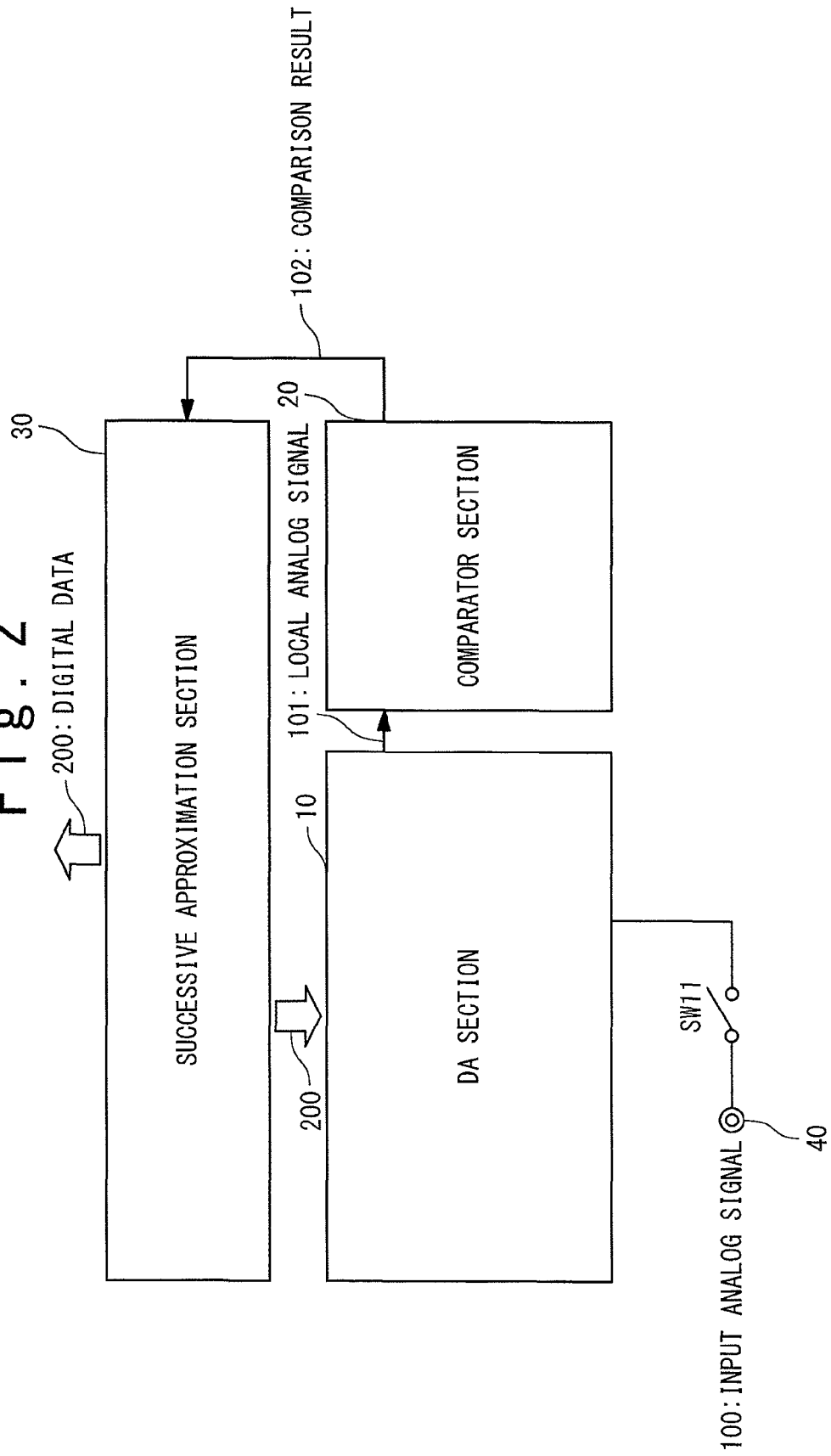
FIG. 2 is a diagram showing a configuration of a successive approximation type AD converter according to the present invention.

FIG. 2 is a diagram showing a configuration of the successive approximation type AD converter according to the present invention. The successive approximation type AD converter according to the present invention includes a DA section 10, a comparator section 20, and a successive approximation section 30. The DA section 10 and the comparator section 20 may be collectively referred to as a conversion comparison section. The DA section 10 in the present embodiment has a C-R type DAC, and outputs a local analog signal 101 corresponding to digital data supplied from the successive approximation section 30. The comparator section 20 compares an analog signal 100 supplied to an analog input terminal (hereinafter, to be referred to as an input analog signal 100) with an analog signal corresponding to the digital data 200 on the basis of the local analog signal 101 from the DA section 10. This comparison result 102 is outputted to the successive approximation section 30. The successive approximation section 30 has a successive approximation register (not shown in the drawing) for retaining the 12-bit digital data 200, and changes a value of the digital data 200 in the register, depending on the comparison result 102. For example, the successive approximation section 30 outputs the digital data 200 when a signal level (a logical value) of the comparison result 102 as the digital data (a digital conversion result) corresponding to the input analog signal 100.

Figure 3:
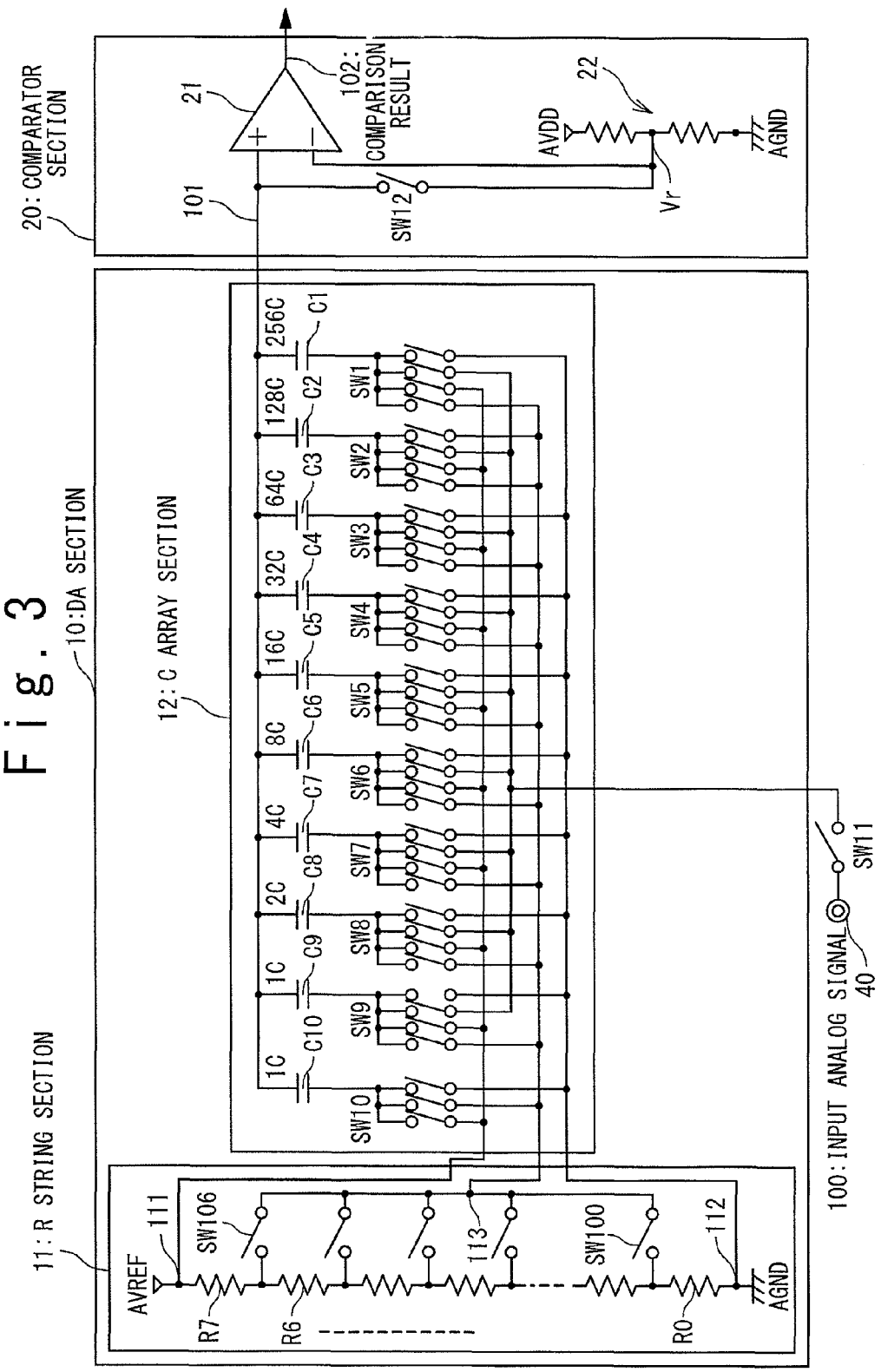
FIG. 3 shows a configuration of a DA section and a comparator section of the successive approximation type AD converter according to a first embodiment of the present invention.

FIG. 3 shows configurations of the DA section 10 and the comparator section 20 of the successive approximation type AD converter according to the first embodiment of the present invention. Referring to FIG. 3, details of the configurations the DA section 10 and the comparator section 20 in the first embodiment will be described. The DA section 10 includes an R string section 11 and a C array section 12.

The R string section 11 includes a plurality of resistances R0 to R7 connected in series between a power supply terminal 111 to which a reference voltage AVREF (a first reference voltage) is supplied and a power supply terminal 112 to which a ground voltage AGND (a second reference voltage) is supplied. In the plurality of resistances R0 to R7, the respective connection nodes are connected to an output terminal 113 via switches SW100 to SW 106 to form an R string (also referred to as a resistance ladder). That is, the reference voltage AVREF is divided by the resistances R0 to R7, and is outputted to the output terminal 113 via the switches SW100 to SW106. The switches SW100 to SW106 are controlled to be turned on or off on the basis of lower 3 bits of the digital data 200 supplied from the successive approximation section 30. According to this configuration, the R string section 11 serves as a voltage resistance dividing DAC for converting the lower 3 bits of the digital data 200 into analog data.

The C array section 12 includes a plurality of capacitances C1 to C10 and the plurality of switches SW1 to SW10. One ends of the capacitances C1 to 010 are connected to a non-inversion input terminal of the comparator 21 of the comparator section 20. The other ends of the capacitances C1 to C9 are connected to the switches SW1 to SW9 having the same configuration, respectively. The other end of the capacitance C10 is connected to the switch SW10. When a unit capacitance value is C, capacitance values of the capacitances C1 to C9 are set to 256C, 128C, 64C, 32C, 16C, 8C, 4C, 2C, and C, respectively. In addition, a capacitance value of the capacitance C10 is set to the unit capacitance value C.

Figure 4:
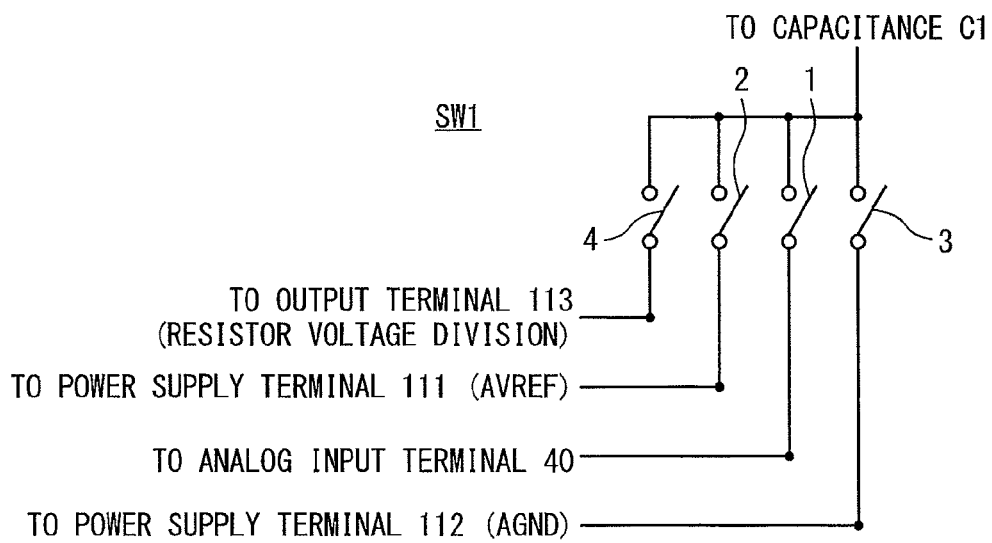
FIG. 4 is a diagram showing a configuration of a switch circuit for controlling a connection between a capacitance array section and an R string section.

FIG. 4 is a diagram showing details of a configuration of the switch SW1. The switches SW1 to SW9 in the first embodiment have the same configuration shown in FIG. 4, and accordingly explanations of the configurations of other switches SW2 to SW9 are omitted.

The switch SW1 includes contacts 1 to 4. The contact 1 controls connection between the analog input terminal 40 and the capacitance C1. The contact 1 is controlled to be turned on or off on the basis of a control signal not shown in the drawing, and is turned on when the input analog signal 100 is sampled and is turned off in other periods.

The contact 2 controls connection between the power supply terminal 111 (AVREF) and the capacitance C1. The contact 3 controls a connection between the power supply terminal 112 (AGND) and the capacitance C1. In the contacts 2 and 3, a switching operation is controlled on the basis of the digital data 200. The on and off of the contacts 2 and 3 in each of the switches SW1 to SW9 is controlled on the basis of upper 9 bits of the digital data 200. For example, the contacts 2 and 3 of the switch SW1 are controlled on the basis of a data value (a logical value) of the MSB. In the case of a data value "1", the contact 2 is turned on, the contact 3 is turned off, and the reference voltage VREF is supplied to the capacitance C1, and in the case of a data value "0", the contact 3 is turned on, the contact 3 is turned off, and the other end of the capacitance C1 is grounded. In the same manner, the contacts 2 and 3 in the switches SW2 to SW9 are controlled on the basis of the data value of upper 2 to 9 bits.

As described above, since the capacitance value of each of the capacitances C1 to C9 is set to be a size according to upper 9 bits, the weighting corresponding to upper 9 bits of the digital data 200 can be given to the local analog signal 101 on the basis of the on-off states of the respective contacts 2 and 3.

The contact 4 controls connection between the output terminal 113 of the R string section 11 and the capacitor C1. The contact 4 is controlled to be turned off in an ordinary operation mode in which the digital conversion is carried out. In addition, also, when a conversion precision measurement only to upper bits is carried out in a test mode, the contact 4 is controlled to be turned off in the same manner as that of the ordinary operation mode. During the off state of the contact 4, the contacts 2 and 3 are controlled, so that the local analog signal 101 receives the weighting according to the digital data 200 by the C array section 12. Meanwhile, when the conversion precision measurement only to lower bits is carried out in the test mode, the contact 4 is set to an on state. In other words, by turning on the contact 4 and connecting the output terminal 113 to the capacitances C1 to C9, the successive approximation type converter serves as a 3-bit AD converter only using the R string section 11.

Figure 5:
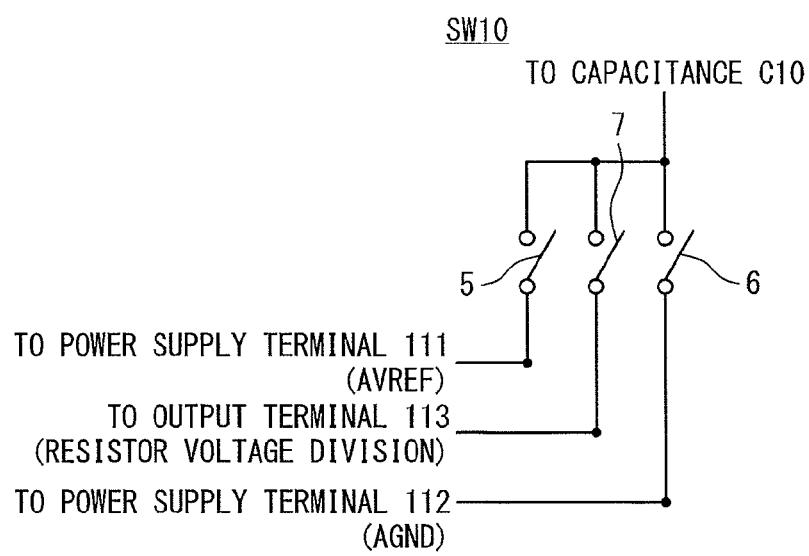
FIG. 5 is a diagram showing a configuration of the switch circuit for controlling a connection between the capacitance array part and the R string part.

FIG. 5 is a diagram showing details of a configuration of the switch SW10. The switch SW10 includes the contacts 5 to 7. The contact 5 controls a connection between the power supply terminal 111 (AVREF) and the capacitance C10. The contact 6 controls a connection between the power supply terminal 112 (AGND) and the capacitance C10. When the weighting to the local analog signal 101 is carried out, the contacts 5 and 6 are controlled on the basis of a control signal (not shown in the drawing) corresponding to a bit position to be weighted. Specifically, the switching operations of the contacts 5 and 6 are controlled on the basis of the DAC to perform the weighting operation. For example, when the weighting to the local analog signal 101 is carried out on the basis of upper 9 bits of the digital data 200 in the ordinary operation mode, the contact 5 is turned off, the contact 6 is turned on, and thereby the power supply terminal 111 (AVREF) and the capacitance C10 are connected to each other. Meanwhile, when the weighting to the local analog signal 101 is carried out on the basis of lower 3 bits of the digital data 200, both of the contacts 5 and 6 are turned off.

The contact 7 controls a connection between the output terminal 113 of the R string section 11 and the capacitor C10. In the weighting operation based on upper bits of the digital data 200 in the ordinary operation mode, the contact 7 is turned off. Additionally, also when the conversion precision measurement only to upper bits thereof is carried out in the test mode, the contact 7 is controlled to be turned off in the same manner as that of the ordinary operation mode. During the off state of the contact 7, the contacts 2 and 3 of the switches SW1 to SW9 are controlled, such that the weighting operation to the local analog signal 101 is carried out by the C array section 12 on the basis of the digital data 200. Meanwhile, when the weighting operation is performed based on lower bits of the digital data 200 in the ordinary operation mode, the contact 7 is tuned on to connect the output terminal 113 to the capacitance C10. Also, when the conversion precision measurement only to lower bits is carried out in the test mode, the contact 7 is turned on. In other words, by turning on the contact 7 and connecting the output terminal 113 to the capacitances C1 to C9, the successive approximation type AD converter serves as the 3-bit AD converter only using the R string section 11.

The comparator section 20 includes a comparator 21, a reference voltage generation circuit 22, and the switch SW12. The reference voltage generating circuit 22 supplies a voltage obtained by dividing the power supply voltage AVDD by resistances to an inversion input terminal of the comparator 21 as a reference voltage Vr. Here, the switch SW12 is provided between a reference voltage generating circuit 22 and the non-inversion input terminal, and controls the supply of the reference voltage Vr to the inversion input terminal. The switch SW12 is controlled to be turned on in the sampling of the input analog signal 100 and to be turned off in other periods.

The comparator 21 compares the local analog signal 101 with the reference voltage Vr, and outputs the comparison result 102 to the successive comparison section 30. For example, when a voltage value of the local analog signal 101 is higher than the reference voltage Vr, the comparator 21 outputs the comparison result 102 of a high level "1", and in the case of being lower, outputs the comparison result 102 of a low level "0". Here, when the voltage of the input analog signal 100 is Vin, a voltage value of the local analog signal 101 in the sampling of the input analog signal 100 becomes Vin+Vr. After that, when the weighting operation by the C array section 12 and the R string section 11 is carried out, a voltage value of the local analog signal 101 becomes Vin+Vr+Vh (here, Vh by the R string section 11 and the C array section shows a weighting amount). The comparator 21 compares the weighted local analog signal 101 (Vin+Vr+Vh) with the reference voltage Vr. For example, the comparator 21 compares the input analog signal 100 (Vin) with an analog signal (Vh) corresponding to the digital data 200 as a result. For example, when the local analog signal 101 (Vin+Vr+Vh) is higher than the reference voltage Vr, it can be determined that the voltage value (Vin) of the input analog signal 100 is higher than the voltage value (Vh) of a generated analog signal corresponding to the digital data. Or, when the local analog signal 101 (Vin+Vr+Vh) is lower than the reference voltage Vr, it can be determined that the voltage value (Vin) of the input analog signal 100 is lower than the voltage value (Vh) of a generated analog signal corresponding to the digital data.

The successive approximation section 30 counts up the digital data 200 on the basis of the comparison result 102 of the high level "1" and counts down the digital data 200 on the basis of the comparison result 102 of the low level "0". In this case, the successive comparison section 30 successively sets a data value from upper bits in turn.

Meanwhile, the switch SW11 is provided between the contact 1 and the analog input terminal 40. When the switches 1 and the switches SW11 and SW12 are synchronously turned on, the input analog signal 100 is sampled. Then, the switches SW11 and SW12 are set to be turned off in a period during which the weighting operation is carried out to the local analog signal 101.

(Normal Operation)

Figure 6:
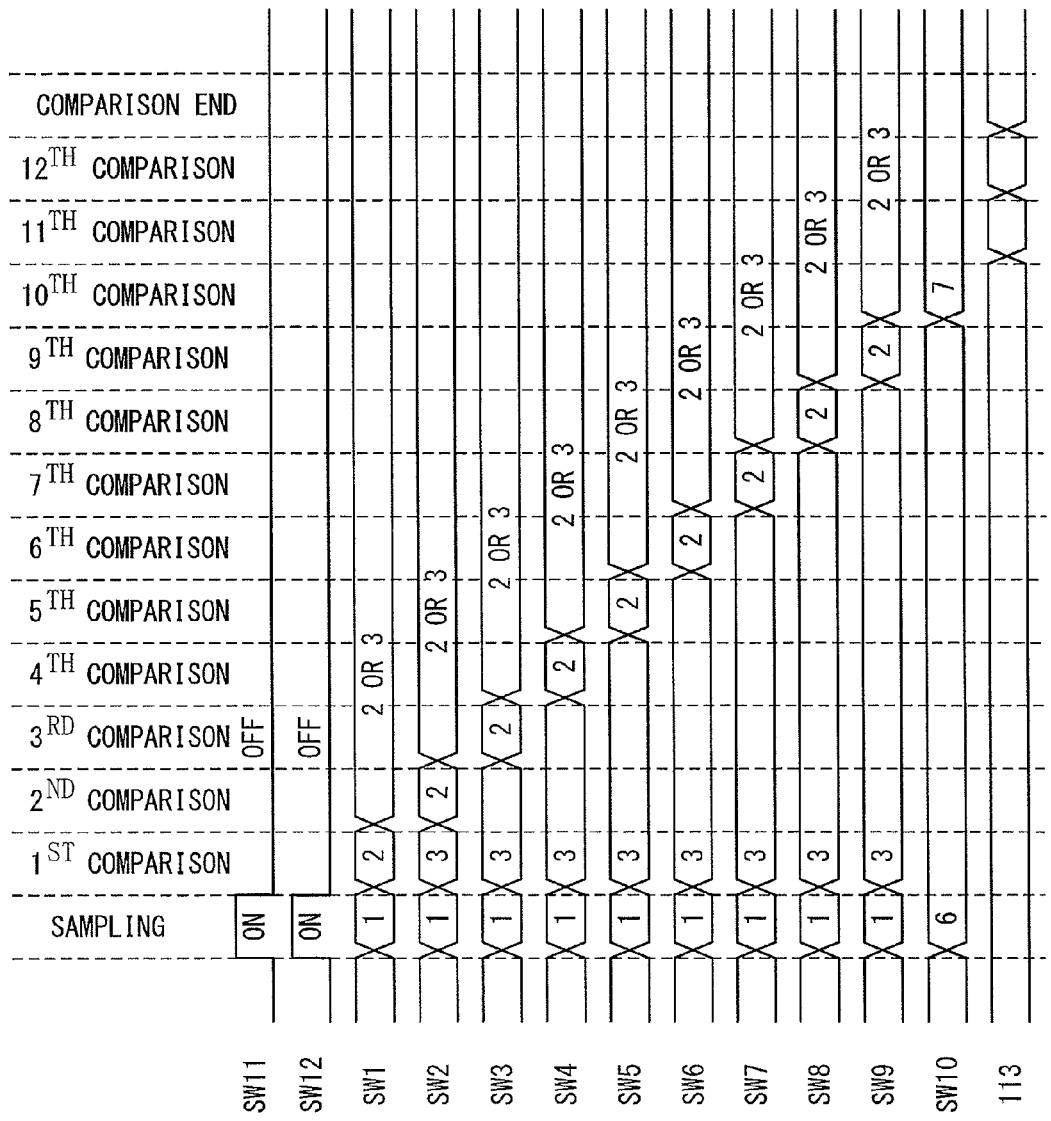
FIG. 6 shows timing charts in a digital conversion operation (in a normal operation) according to the present invention.

Next, referring to FIG. 6, one example of a digital conversion operation (in the ordinary operation) of the successive approximation type AD converter according to the present invention will be described. FIG. 6 shows timing chart in the digital conversion operation (in the ordinary operation) according to the present invention.

Firstly, the analog signal inputted to the successive approximation type AD converter (the input analog signal 100) is sampled. All the switches 1 of the switch circuits SW1 to SW9 and the switches SW11 and SW12 are turned on, and other switches 2 to 4 are turned off. In this manner, the capacitances C1 to C9 are charged based on the input analog signal 100 and the reference voltage Vr is supplied, and thus a voltage value of the local analog signal 101 becomes Vin+Vr. In this case, since the contact 6 of the switch circuit SW10 is turned on, the other end of the capacitance C10 is grounded.

When the input analog signal 100 is sampled, the successive approximation operation is then performed. Here, the values of the digital data 200 are set from the MSB to the LSB in turn. At first, upper 9 bits of the digital data 200 corresponding to the input analog signal 100 is set from the MSB in turn through the DA conversion (the weighting) by the C array section 12 and through the comparing operation by the comparator section 20. During this period, only the contact 6 is turned on in the switch circuit SW10, and the other end of the capacitance C10 is grounded.

In a first comparing operation, only the contact 2 in the switch circuit SW1 is turned on, and other switches 1, 3, and 4 are turned off. In this case, only the switches 3 are turned on in the switch circuits 2 to 9, and other switches 1, 2, and 4 are turned off. In this manner, the reference voltage AVREF is supplied only to the capacitance C1, and other capacitances C2 to C9 are grounded. The intensity of the local analog signal 101 is changed through the weighting operation based on voltages supplied to the capacitances C1 to 010. In the first comparing operation, the local analog signal 101 is changed through the weighting operation corresponding to digital data "1000_0000_0000". Accordingly, the comparison result 102 between the local analog signal 101 and the reference voltage Vr shows a comparison result between an analog signal corresponding to the digital data "1000_0000_0000" and the input analog signal 100.

The successive approximation section 30 sets a value of the MSB on the basis of the comparison result 102. For example, when the local analog signal 101 is smaller than the reference voltage Vr, that is, when the analog signal corresponding to the digital data "1000_0000_0000" is smaller than the input analog signal 100, the MSB is set to be "1", and then the contact 2 of the switch circuit SW1 is set to be turned on and the contact 3 is set to be turned off. Or, when the local analog signal 101 is larger than the reference voltage Vr, that is, when the analog signal corresponding to the digital data "1000_0000_0000" is larger than the input analog signal 100, the MSB is set to be "0", and then the contact 3 of the switch circuit SW1 is set to be turned on and the contact 2 is set to be turned off.

The successive approximation type AD converter sets the data values of 2nd bit to 9th bit of the upper bits in turn in the same manner as that of the setting operation of the MSB. That is, data "1" is set to each bit and then the analog conversion is carried out, and on the basis of the comparison result between the values and the input analog signal 100, values of the respective bits are determined. The upper 9 bits of the digital data 200 based on the input analog signal 100 are set by successively carrying out this operation from MSB.

When 9th bit data is set, the contact 7 of the switch circuit SW10 is turned on, and other switches 5 and 6 are turned off. In this manner, the other end of the capacitance C10 is connected to the output terminal 113 of the R string section 11, and then a resistance divided voltage set by the R string section 11 is supplied to the other end of the capacitance C10. Accordingly, the DA conversion of lower 3 bits of the digital data (the weighting) and the comparing operation are carried out, the lower 3 bits of the digital data 200 are set. For example, the R string section 11 supplies a resistance divided voltage according to data "1" set to a 10th bit of the digital data 200 to the capacitance C10 via the output terminal 113. The level of the local analog signal 101 is changed based on the weight which is determined based on the resistance divided voltage supplied to the capacitance C10. Here, the successive comparison section 30 sets a data value of the 10th bit on the basis of the comparison result 102 between the analog signal corresponding to the digital data 200 in which the 10th bit is "1" and the input analog signal 100. After this, an 11th bit and a 12th bit of the digital data 200 are set in the same manner.

In the above-described DA conversion and successive approximation operation, the input analog signal 100 is converted into the digital data 200.

(Test Operation)

Figure 7:
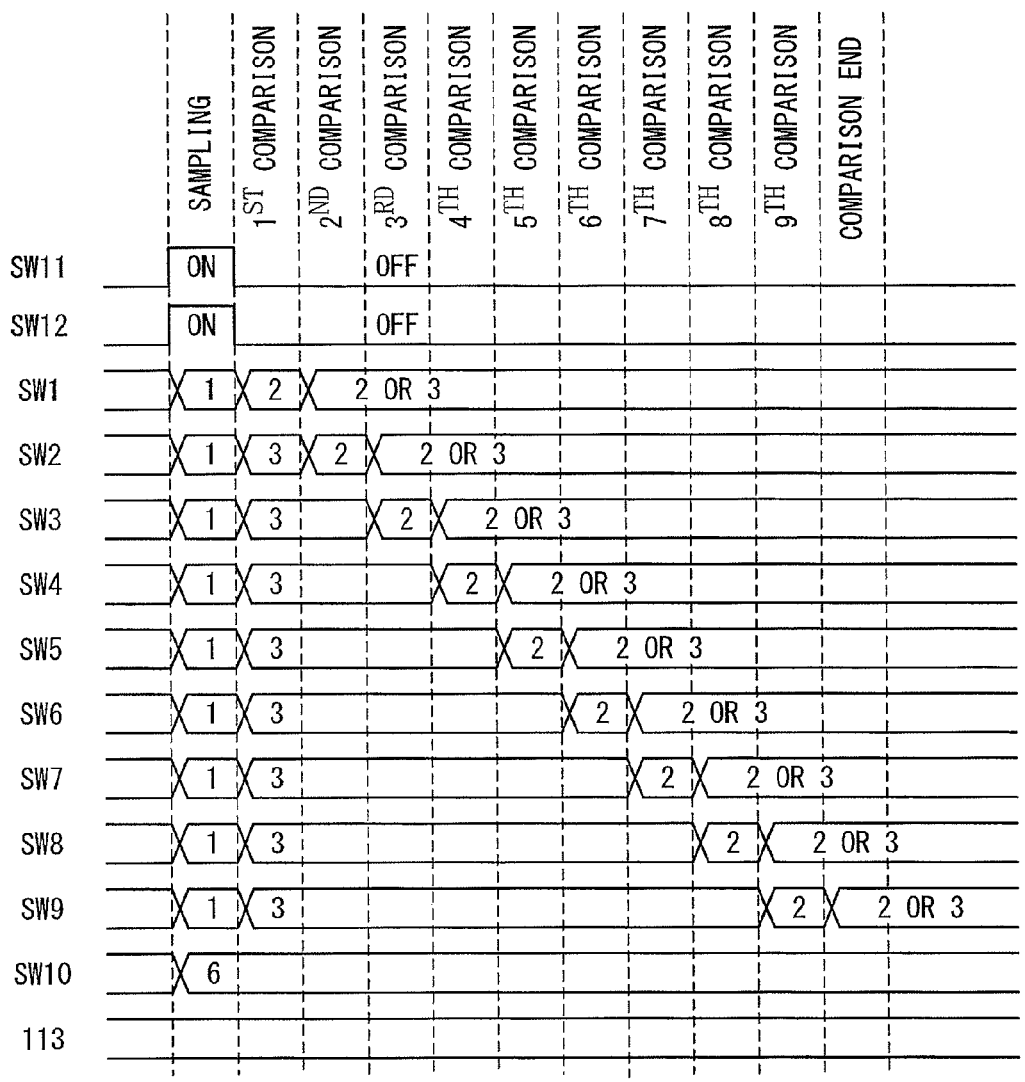
FIG. 7 shows timing charts in a test operation of an AD conversion precision of the successive approximation type AD converter according to a first embodiment.
Figure 8:
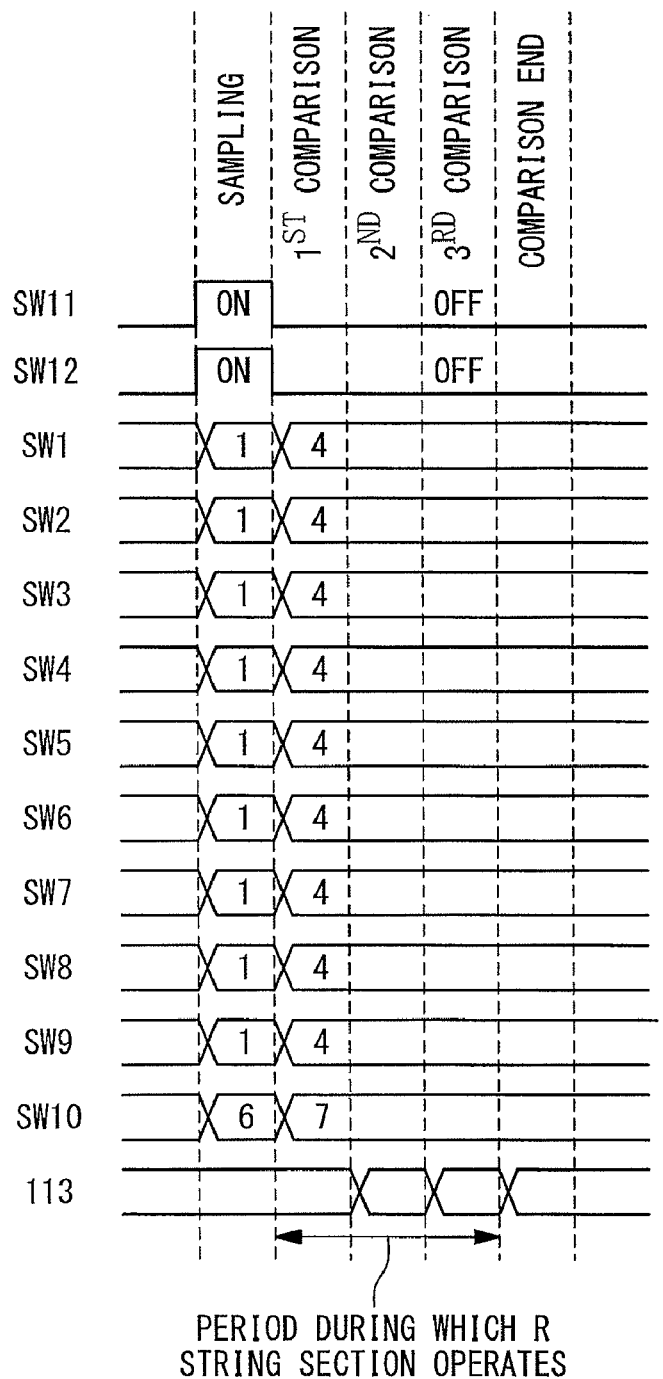
FIG. 8 shows timing charts in the test operation of the AD conversion precision of the successive approximation type AD converter according to the first embodiment.

Next, referring to FIGS. 7 and 8, the test operation of an AD conversion precision of the successive approximation type AD converter in the first embodiment will be described. FIGS. 7 and 8 show timing charts in the test operation of the AD conversion precision of the successive approximation type AD converter in the first embodiment.

In the AD conversion precision test according to the present embodiment, a 12-bit AD converter is separated into two converters: one is a 9-bit AD converter using the C array art 12 (an electric charge distribution type DAC) and the other one is the 3-bit AD converter using the R string section 11 (a voltage resistance—dividing type DAC), and measurement precisions of the respective converters are measured. In this manner, the AD conversion precision can be measured by a tester with low precision, for example, a 10-bit tester without preparing a high-precision tester such as a 12-bit tester.

In the present embodiment, a 9-bit AD conversion precision using the C array section 12 is measured in a first test operation, and a 3-bit AD conversion precision using the R string section 11 is measured in a second test operation. In these test operations, a digital conversion precision test and failure detection to the 12-bit AD converter are carried out.

(First Test Operation: AD Conversion Precision Measurement of 9-Bit AD Converter)

Referring to FIG. 7, the first test operation will be described. In the first test operation, the contact 6 of the switch circuit SW10 is turned on and other switches 5 and 7 are turned off, and thus the weighting operation to the local analog signal 101 by the R string section 11 is not carried out. In this manner, the successive approximation type AD converter serves as the 9-bit AD converter only using the C array section 12.

In the first test operation, the same operation as the 9th bit comparing operation is carried out from the sampling in the ordinary operation mode. Firstly, the input analog signal 100 supplied to the successive approximation type AD converter is sampled. Specifically, all the switches 1 of the switch circuits SW1 to SW9 and the switches SW11 and SW12 are turned on, and other switches 2 to 4 thereof are turned off. In this manner, the capacitances C1 to C9 are charged based on the input analog signal 100 and the reference voltage Vr is supplied, and thus a voltage value of the local analog signal 101 becomes Vin+Vr. In this case, since the contact 6 of the switch circuit SW10 is turned on, the other end of the capacitance C10 is grounded.

When the input analog signal 100 is sampled, the successive approximation operation is performed. Here, the 9-bit digital data 200 corresponding to the input analog signal 100 is set from the MSB in turn through the DA conversion (the weighting operation) by the C array section 12 and the comparing operation by the comparator section 20. During this period, only the contact 6 is turned on in the switch circuit SW10, and the other end of the capacitance C10 is grounded.

When the digital data 200 is set to the 9th bit, the digital data 200 is detected by the tester to measure the conversion precision. In this manner, the AD conversion precision of the 9-bit successive approximation type AD converter can be tested only using the C array section 12.

(Second Test Operation: AD Conversion Precision Measurement of 3-Bit AD Converter)

In the second test operation, when the switches 4 of the switch circuits SW1 to SW9 and the contact 7 of the switch circuit SW10 are set to be turned on, the local analog signal 101 is weighted only by the R string section 11. In this manner, the successive approximation type AD converter serves as the 3-bit AD converter using the DA conversion result of the R string section 11.

Before the second test operation is carried out, the charge amounts are reset to be 0 in the capacitances C1 to 010, by connecting to the power supply terminal 112 (AGND) (not shown in the drawing). From the state in which the capacitances C1 to C10 are reset, the sampling of the input analog signal 100 begins. Specifically, all the switches 1 of the switch circuits SW1 to SW9 and the switches SW11 and SW12 are turned on, and other switches 2 to 4 thereof are turned off. In this manner, the capacitances C1 to C9 are charged based on the input analog signal 100 and the reference voltage Vr is supplied, and thus a voltage value of the local analog signal 101 becomes Vin+Vr. In this case, since the contact 6 of the switch circuit SW10 is turned on, the other end of the capacitance C10 is grounded.

When the input analog signal 100 is sampled, the successive approximation operation is performed. Here, the 3-bit digital data 200 corresponding to the input analog signal 100 is set from the MSB in turn through the DA conversion (the weighting operation) by the R string section 11 and the comparing operation by the comparator section 20. During this period, all the switches 4 of the switch circuits SW1 to SW9 are turned on, and other switches 1 to 3 thereof are turned off. In addition, the contact 7 of the switch circuit SW10 is turned on, and other switches 5 and 6 are turned off. In this manner, the other ends of the capacitances C1 to C10 are connected to the output terminal 113 of the R string section 11.

In the successive approximation operation in the second test operation, the weighting operation to the local analog signal 101 is carried out by controlling the switch circuits SW100 to SW106 in the R string section 11 on the basis of the 3-bit digital data 200. That is, the resistance divided voltage of corresponding to the 3-bit digital data 200 is supplied to the capacitances C1 to C10, and thereby the level of the local analog signal 101 is changed. The successive approximation section 30 sets the 3-bit digital data from the MSB in turn on the basis of the comparison result 102 between the local analog signal 101 and the reference voltage Vr.

When the digital data 200 is set to a 3rd bit, the digital data 200 is detected by the tester to measure the conversion precision. In this manner, the AD conversion precision of the 3-bit successive approximation type AD converter only using the DA conversion by the R string section 11 can be tested.

In the present invention, it is determined whether the 9-bit AD converter is defective device in serving as the 9-bit AD converter, by comparing the AD conversion result and an expectation value in the first test operation. Also, it is determined whether the 3-bit AD converter is defective device in serving as the 3-bit AD converter, by comparing the AD conversion result and the expectation value in the second test operation. According to the two tests, an operation check and a failure detection as the 12-bit AD converter shown in FIG. 3 can be carried out.

In the first and second test operations, the test can be carried out by the tester which can only measure an AD converter with low resolution. That is, when the mass production test is carried out to the successive approximation type AD converter with high resolution, the tester with low precision can be used, and accordingly the test cost can be reduced.

In the conventional technique, the ordinary AD conversion operation was carried out in order to determine an element failure in the AD converter. In this case, the AD converter with 12 bits or more was hard to stably measure with the precision of a general digital LSI tester. On the contrary, according to the present invention, the test is carried out by making the AD converter with 12 bits or more serve as the AD converter with low resolution (for example, the 9-bit AD converter and the 3-bit AD converter). For this reason, the measurement precision required to the LSI tester is reduced, and accordingly the element failure of the AD converter can be determined in a state that the stable measurement is possible.

[Second Embodiment]

In the first embodiment, the 12-bit successive approximation type AD converter is tested by the test to the 3-bit AD converter only using the DA converter by the R string section 11, and the test to the 9-bit AD converter only using the DA converter by the C array section 12 (the electric charge distribution type DAC). That is, in the first embodiment, the resolution of the AD converter to be tested is reduced by testing the successive approximation type AD converter only using one of two stages of the DAC (either one of portions corresponding to the upper bits and the lower bits).

Meanwhile, in a second embodiment, the test of the conversion precision is carried out by using the AD converter only using either one of the two stages of the DAC (for example, the upper bits) and the AD converter in which the resolution in one of the two stages of the DAC (for example, the upper bits) is lowered.

Figure 9:
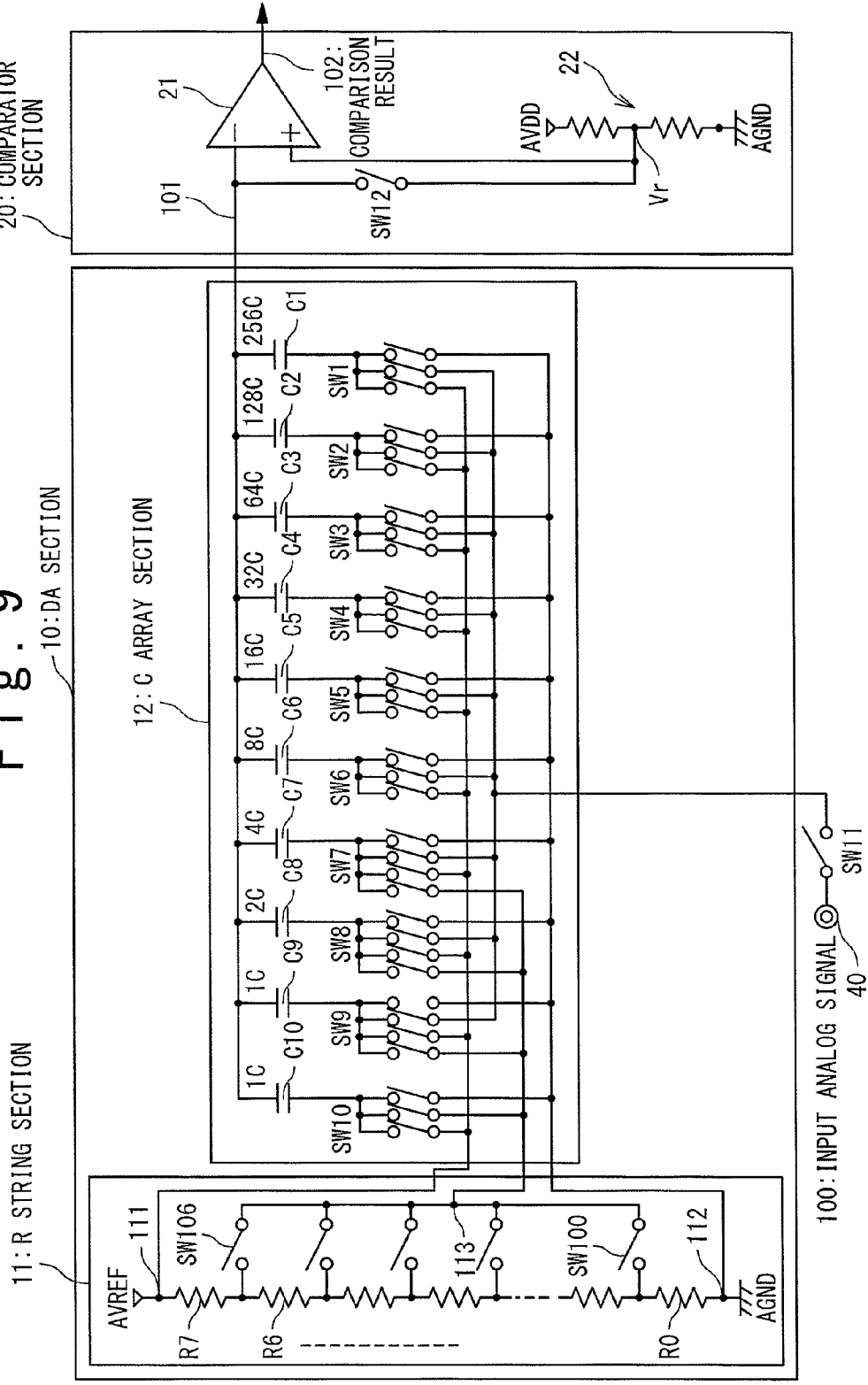
FIG. 9 shows a configuration of a DA section and a comparator section of the successive approximation type AD converter according to a second embodiment of the present invention.
Figure 10:
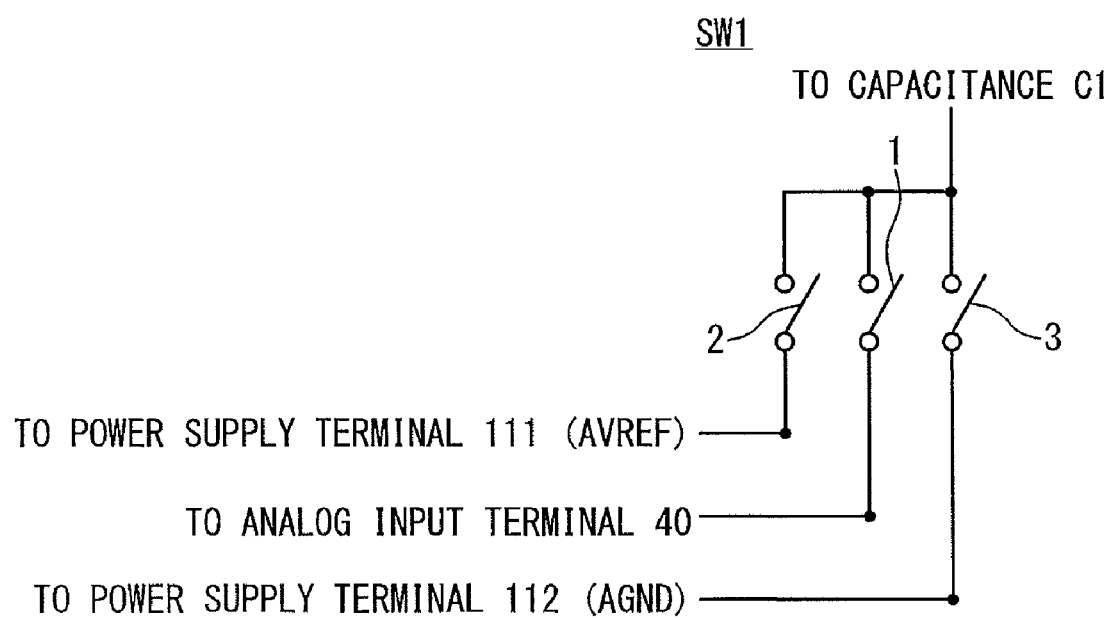
FIG. 10 is a diagram showing a configuration of a switch circuit for controlling a connection between the capacitance array section and the R string section in the second embodiment.
Figure 11:
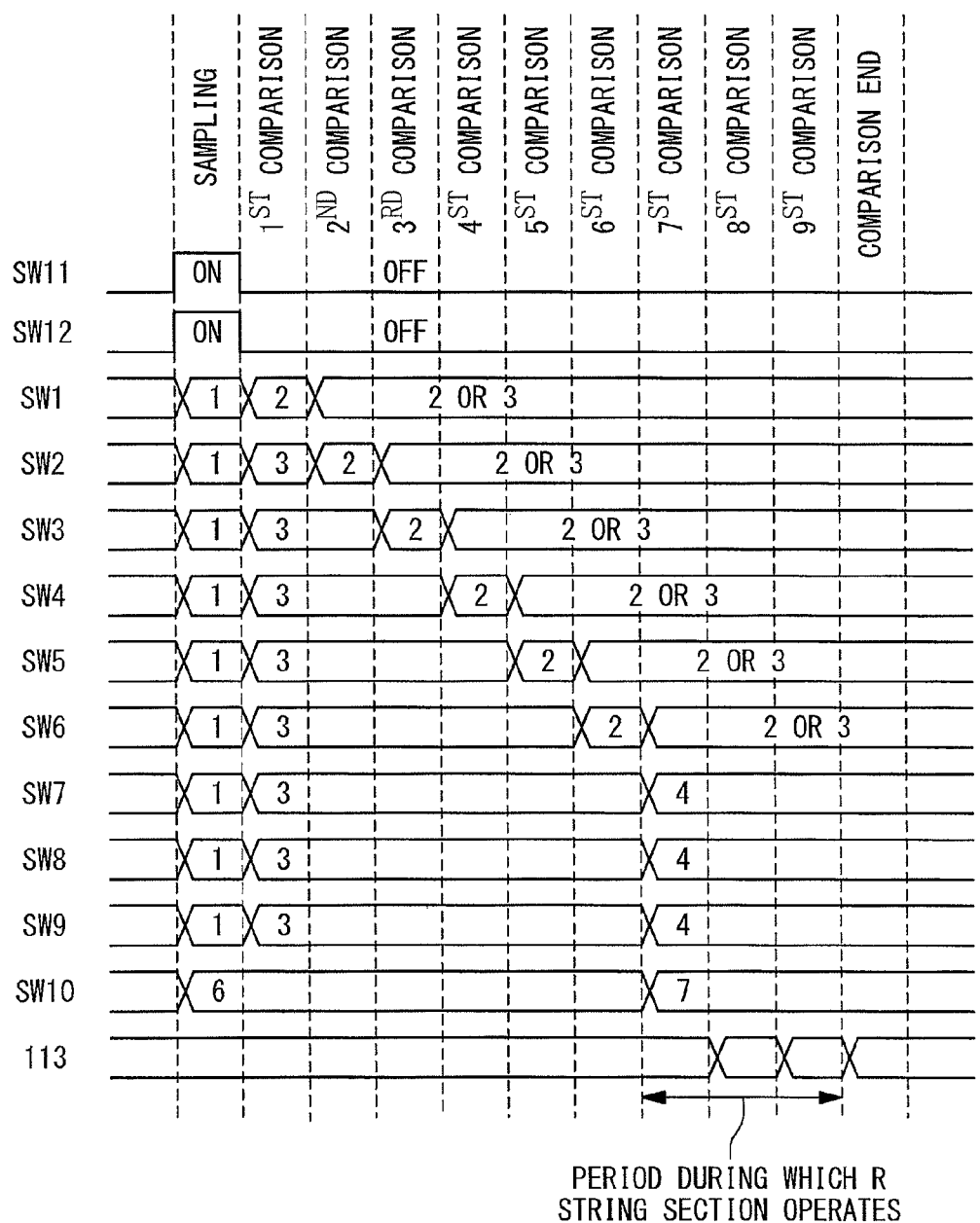
FIG. 11 shows timing charts in a test operation of an AD conversion precision of the successive approximation type AD converter according to the second embodiment.

Referring to FIGS. 9 to 11, the successive approximation type AD converter according to the second embodiment of the present invention will be described.

(Configuration)

The overall configuration of the successive approximation type AD converter according to the second embodiment is the same as that of the first embodiment as shown in FIG. 2, and accordingly the description thereof is omitted. In addition, since configurations of the R string section 11 and the comparator section 20 are the same between the first embodiment and the second embodiment, the C array section 12 having a different configuration will be described below.

FIG. 9 shows a configuration of the DA section 10 and the comparator section 20 in the successive approximation type AD converter according to the second embodiment of the present invention. FIG. 10 is a diagram showing a configuration of contacts of the switch for controlling connection between the capacitance array section 12 and the R string section 11 in the second embodiment. Referring to FIGS. 9 and 10, the C array section 12 in the present embodiment has a configuration in which the contact 4 for controlling the connection to the R string section 11 (the output terminal 113) is removed from the switch circuit of switches SW1 to SW6 in the first embodiment. Other configurations in the C array section 12 are the same as those in the first embodiment.

Meanwhile, the number of switches in the configuration shown in FIG. 9 is determined on the basis of a resolution (n bits) set in a second test operation described later, and the number m of lower bits which can be set in the R string section 11. In this case, (n-m) switches have the configuration shown in FIG. 9, and the remaining switches have the configuration shown in FIG. 3. For example, when n is 9 and the number of lower bits is 3 as shown in the second embodiment, six switches SW1 to SW6 are configured as shown in FIG. 9, other switch circuits SW7 to SW9 are configured as shown in FIG. 3. Meanwhile, in the first embodiment, because n is 3, the switches are not configured as shown in FIG. 9 and all of the switches SW1 to SW9 are configured to include the contact 4 for controlling connection to the R string section 11 (the output terminal 113) as shown in FIG. 3.

(Ordinary Operation)

The ordinary operation (the digital conversion operation) in the second embodiment is the same as that of the first embodiment, and accordingly the explanation is omitted.

(Test Operation)

Next, referring to FIG. 11, the test operation of the AD conversion precision of the successive approximation type AD converter in the first embodiment will be described. FIG. 11 shows timing charts in the test operation of an AD conversion precision of the successive approximation type AD converter in the second embodiment.

In an AD conversion precision test according to the present embodiment, the 12-bit AD converter is separated into two converters: one is an upper 9-bit AD converter using the C array art 12 (an electric charge distribution type DAC) and the other is an n-bit AD converter (n is an integer, and 11 or less) including the 3-bit AD converter using the R string section 11 (a voltage resistance—dividing type DAC), and conversion precisions of the respective converters are measured. In this manner, the AD conversion precision can be measured without preparing a high-precision tester such as a 12-bit tester. For example, when n is 10 or less, the AD conversion precision can be measured by a low-precision tester such as the 10-bit tester.

In the present embodiment, a 9-bit AD conversion precision using the C array section 12 is measured in a first test operation, and a 6-bit AD conversion precision using the R string section 11 and the C array section 12 is measured in a second test operation. In these test operations, a digital conversion precision test and a failure detection to the 12-bit AD converter are carried out.

The first test operation is the same as that of the first embodiment, and accordingly the explanations will be omitted.

(Second Test Operation: AD Conversion Precision Measurement of 9-Bit AD Converter)

In the second test operation, the digital data 200 from the MSB to the 6th bit is tested in the same manner as that in the first test operation. However, with 7th to 9th bits, the contacts 4 of the switches SW7 to 9 and the contact 7 of the switch SW10 are set to be turned on, and the local analog signal 101 is weighted by the C array section 12 and the R string section 11. In this manner, the successive approximation type AD converter serves as the 9-bit AD converter using the DA conversion result by the R string section 11 and the C array section 12.

Before the second test operation is carried out, the capacitances C1 to C10 are connected to the power supply terminal 112 (AGND) to reset the charge amount to be 0 (not shown in the drawing). From the state in which the capacitances C1 to C10 are reset, the sampling of the input analog signal 100 starts. Specifically, all the contacts 1 of the switches SW1 to SW9 and the switches SW11 and SW12 are turned on, and other contacts thereof 2 to 4 are turned off. In this manner, the capacitances C1 to C9 are charged and the reference voltage Vr is supplied by the input analog signal 100, and thus a voltage value of the local analog signal 101 becomes Vin+Vr. In this case, since the contact 6 of the switch circuit SW10 is turned on, the other end of the capacitance C10 is grounded.

When the input analog signal 100 is sampled, the operation progresses to the successive approximation operation. Here, in the same manner as those of the ordinary operation mode and the first test operation, the 9-bit digital data 200 corresponding to the input analog signal 100 is set from the MSB to the 6th bit in turn through the DA conversion (the weighting) by the C array section 12 and the comparison operation by the comparator section 20. During this period, only the contact 6 is turned on in the switch circuit SW10, and the other end of the capacitance C10 is grounded.

The setting of the 7th bit and the subsequent bits is carried out through the DA conversion (the weighting) by the R string section 11 and the comparison operation by the comparator section 20. During this period, the switching states of the switches SW1 to SW6 are maintained in the states determined as above-mentioned. In addition, the contacts 4 of the switches SW7 to SW9 are turned on, and other contacts 1 to 3 are turned off. Moreover, the contact 7 of the switch circuit SW10 is turned on, and other contacts 5 and 6 are turned off. In this manner, other ends of the capacitances C7 to C10 are connected to the output terminal 113 of the R string section 11.

In the successive approximation operation for setting dada values of lower 3 bits (7 to 9 bits) in the second test operation, the weighting operation to the local analog signal 101 is carried out by controlling the switches SW100 to SW106 in the R string section 11 on the basis of the 3-bit digital data 200. That is, the resistance division voltage for the 3-bit digital data 200 is supplied to the capacitances C7 to C10, and thereby the value of the local analog signal 101 is changed. The successive approximation section 30 sets the lower 3-bit digital data from the 7th bit in turn on the basis of the comparison result 102 between the local analog signal 101 and the reference voltage Vr.

When the digital data 200 is set to the 9th bit, the digital data 200 is detected by the tester to measure the conversion precision. In this manner, the AD conversion precision of the 9-bit successive approximation type AD converter using the DA conversion by the R string section 11 and the C array section 12 can be tested.

In the present embodiment, whether the 9-bit AD converter is a defective device is determined by comparing the AD conversion result when operating as the 9-bit AD converter by using only the C array section 12 and an expectation value in the first test operation. Whether the 9-bit AD converter including the R string section 11 is a defective device is determined by comparing the AD conversion result when serving as the 9-bit AD converter including the R string section 11 and an expectation value in the second test operation. According to the two tests, an operation check and a failure detection as the 12-bit AD converter shown in FIG. 9 can be carried out.

In the successive approximation type AD converter in the second embodiment, the number of signal lines and the number of switches can be reduced in comparison with the first embodiment, and accordingly an advantage in a circuit size can be obtained.

Additionally, like the first embodiment, the AD conversion precision test can be carried out in the first and second test operations by the tester with low resolution, respectively. That is, when the mass production test is carried out to the successive approximation type AD converter with high resolution, the tester with low precision can be used, and accordingly the test cost can be reduced.

As described above, since the configuration of the DAC used for setting the digital data can be modified, the successive approximation type AD converter according to the present invention can carry out the conversion precision test in lower resolution than that in the ordinary operation. In this manner, a stable AD precision measurement by an LSI tester with low precision can be realized. In addition, by analyzing the plurality of measurement results obtained by separating the whole or part of DAC used in the ordinary operation and by carrying out the test, a determination of the conversion precision and a detection of a failure position in the successive approximation type AD converter can be carried out in high precision.

The embodiments of the present invention have been described above in detail. However, specific configurations are not limited to the above-mentioned embodiments, and various modifications within a scope of the present invention are included in the present invention. In the embodiments, the successive approximation type AD converter of 12-bit resolution is used as one example. However, an AD converter with further higher resolution may be used. Additionally, in the embodiments, one example using the C-R type DAC has been described. However, the present invention can be applied to a successive approximation type AD converter using any one of an R-C type DAC, an R-R type DAC, and a C-C type DAC. Moreover, the resolution of the DAC of the successive approximation type AD converter is not limited to upper 9 bits and lower 3 bits, and thus a DAC having an arbitrary resolution can be used. In this case, it is needless to say that the resolution of the AD converter to be tested in the first and second test operations can be arbitrarily changed.

What is claimed is:

1. A successive approximation type analog-to-digital (AD) converter comprising:
    a converting and comparing section configured to compare an input analog signal and an analog signal as an analog conversion result of a digital data; and
    a successive approximation section configured to change said digital data based on the comparison result by said converting and comparing section,
    wherein said converting and comparing section comprises:
    a DA (digital-to-analog) section configured to perform an analog conversion on said digital data of a predetermined number of bits in an ordinary mode, and on said digital data of bits smaller than the predetermined number of bits in a test mode.

2. The successive approximation type AD converter according to claim 1, wherein said DA section (10) comprises:
    a first DA converter configured to generate a first voltage corresponding to said digital data on an upper bit side;
    a second DA converter configured to generate a second voltage corresponding to said digital data on a lower bit side; and
    a switch circuit configured to selectively use for the analog conversion, at least one of said first DA converter and said second DA converter.

3. The successive approximation type AD converter according to claim 2, wherein said first DA converter comprises a capacitance array of a plurality of capacitances, one ends of which are connected in common,
    wherein said second DA converter comprises a resistance string of a plurality of resistances which are connected in series between a first reference power supply which supplies a reference voltage and a second reference power supply which supplies a ground voltage, and
    wherein said switch circuit comprises a group of first switches configured to control a connection between the other end of each of said plurality of capacitances and a connection node between two of said plurality of resistances.

4. The successive approximation type AD converter according to claim 1, wherein said DA section comprises:
    a first DA converter configured to generate a first voltage corresponding to said digital data on an upper bit side;

a second DA converter configured to generate a second voltage corresponding to said digital data on a lower bit side; and a switch circuit provided for said first DA converter to change the number of conversion possible bits of said digital data.

5. The successive approximation type AD converter according to claim 4, wherein said first DA converter comprises a capacitance array of a plurality of capacitances, one ends of which are connected in common, wherein said second DA converter comprises a resistance string of a plurality of resistances which are connected in series between a first reference power supply which supplies a reference voltage and a second reference power supply which supplies a ground voltage, and wherein said switch circuit comprises a group of first switches configured to control a connection between the other end of each of said plurality of capacitances and a connection node between two of said plurality of resistances.

6. A test method of a successive approximation type AD (Analog-to-Digital) converter, comprising:

comparing an input analog signal and an analog conversion result of a digital data;

changing a value of said digital data based on said comparison result, wherein said comparing comprises:

performing an analog conversion on said digital data of a predetermined number of bits in an ordinary mode, and on said digital data of bits smaller than the predetermined number of bits in a test mode.

7. The test method according to claim 6, wherein said comparing comprises:

generating a first voltage corresponding to said digital data on an upper bit side by a first DA converter;

generating a second voltage corresponding to said digital data on a lower bit side by a second DA converter;

selecting for the analog conversion, at least one of said first DA converter and second DA converter by a switch circuit; and analog-converting said digital data by the selected DA converter.

8. The test method according to claim 7, wherein said first DA converter comprises a capacitance array of a plurality of capacitances, one ends of which are connected in common, wherein said second DA converter comprises a resistance string of a plurality of resistances which are connected in series between a first reference power supply which supplies a reference voltage and a second reference power supply which supplies a ground voltage, wherein said switch circuit selects one of said first and second DA converters, and wherein said analog-converting comprises:

controlling a connection between the other end of each of said plurality of capacitances and a connection node between two of said plurality of resistances.

9. The test method according to claim 6, wherein said comparing comprises:

generating a first voltage corresponding to said digital data on an upper bit side by a first DA converter;

generating a second voltage corresponding to said digital data on a lower bit side by a second DA converter; and changing the number of conversion possible bits of said digital data by a switch circuit provided for said first DA converter.

10. The test method according to claim 9, wherein said first DA converter comprises a capacitance array of a plurality of capacitances, one ends of which are connected in common, wherein said second DA converter comprises a resistance string of a plurality of resistances which are connected in series between a first reference power supply which supplies a reference voltage and a second reference power supply which supplies a ground voltage, wherein said switch circuit selects one of said first and second DA converters, and wherein said changing comprises:

controlling a connection between the other end of each of said plurality of capacitances and a connection node between two of said plurality of resistances.

* * * * *